United States Patent
Bai et al.

(10) Patent No.: US 9,673,414 B2
(45) Date of Patent: Jun. 6, 2017

(54) ORGANIC LIGHT-EMITTING DIODE AND METHOD FOR PREPARING THE SAME

(71) Applicants: BOE TECHNOLOGY GROUP CO., LTD., Beijing (CN); ORDOS YUANSHENG OPTOELECTRONICS CO., LTD., Ordos (CN)

(72) Inventors: Juanjuan Bai, Beijing (CN); Taegyu Kim, Beijing (CN); Haidong Wu, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia Autonomous Region (CN)

( * ) Notice: Subject to any disclaimer, the term of this patent is extended or adjusted under 35 U.S.C. 154(b) by 0 days.

(21) Appl. No.: 14/769,368

(22) PCT Filed: Oct. 31, 2014

(86) PCT No.: PCT/CN2014/089973
§ 371 (c)(1),
(2) Date: Aug. 20, 2015

(87) PCT Pub. No.: WO2016/008234
PCT Pub. Date: Jan. 21, 2016

(65) Prior Publication Data
US 2016/0301025 A1    Oct. 13, 2016

(30) Foreign Application Priority Data
Jul. 14, 2014 (CN) .......... 2014 1 0334530

(51) Int. Cl.
*H01L 51/50* (2006.01)
*H01L 51/56* (2006.01)

(52) U.S. Cl.
CPC ........ *H01L 51/508* (2013.01); *H01L 51/5056* (2013.01); *H01L 51/5076* (2013.01);
(Continued)

(58) Field of Classification Search
CPC . H01L 51/50; H01L 51/5278; H01L 51/0072; H01L 51/5044; H01L 51/0085; H01L 51/504
(Continued)

(56) References Cited

U.S. PATENT DOCUMENTS

| 2005/0173700 A1* | 8/2005 | Liao ............... H01L 27/3211 257/40 |
| 2006/0240277 A1* | 10/2006 | Hatwar ............ C09K 11/06 428/690 |

(Continued)

FOREIGN PATENT DOCUMENTS

| CN | 101556988 A | 10/2009 |
| CN | 102456844 A | 5/2012 |

(Continued)

OTHER PUBLICATIONS

First Office Action regarding Chinese application No. 201410334530.X, dated Jan. 27, 2016. Translation provided by Dragon Intellectual Property Law Firm.
(Continued)

*Primary Examiner* — Chuong A Luu
*Assistant Examiner* — Rodolfo D Fortich
(74) *Attorney, Agent, or Firm* — Harness, Dickey & Pierce, P.L.C.

(57) ABSTRACT

An organic light-emitting diode and a method for preparing the same are disclosed. The organic light-emitting diode at
(Continued)

least comprises a luminescent layer between an anode and a cathode, and the organic light-emitting diode further comprises at least two electron transport layers set between the luminescent layer and the cathode and an N-type doped layer set between every two adjacent electron transport layers. For the organic light-emitting diode of the invention, an electron transport material and an N-type dopant are sequentially evaporated in turn, and the electron injection and transportation capacity is improved by forming an N-type doping-like effect from interface dope effect and the diffusion of an N-type dopant, so that carrier concentration can be balanced, exciton utilization can be improved, and the photoelectric properties of the OLED device can be improved.

14 Claims, 1 Drawing Sheet

(52) U.S. Cl.
CPC ...... *H01L 51/5088* (2013.01); *H01L 51/5092* (2013.01); *H01L 51/56* (2013.01)
(58) Field of Classification Search
USPC .................. 257/40, 88, 98, 99, 103
See application file for complete search history.

(56) References Cited

U.S. PATENT DOCUMENTS

| | | | |
|---|---|---|---|
| 2008/0118775 A1* | 5/2008 | Kim | ............ B82Y 10/00 |
| | | | 428/690 |
| 2013/0285027 A1* | 10/2013 | Loebl | ............ H01L 51/5076 |
| | | | 257/40 |
| 2014/0103306 A1 | 4/2014 | Moon et al. | |

FOREIGN PATENT DOCUMENTS

| | | |
|---|---|---|
| CN | 102683604 A | 9/2012 |
| CN | 103180993 A | 6/2013 |
| CN | 103730589 A | 4/2014 |
| CN | 103855312 A | 6/2014 |

OTHER PUBLICATIONS

Written Opinion of the International Searching Authority for international application No. PCT/CN2014/089973.
Second Office Action regarding Chinese application No. 201410334530.X, dated Aug. 16, 2016. Translation provided by Dragon Intellectual Property Law Firm.

* cited by examiner

US 9,673,414 B2

ORGANIC LIGHT-EMITTING DIODE AND METHOD FOR PREPARING THE SAME

CROSS-REFERENCE TO RELATED APPLICATION

The present application is the U.S. national phase of PCT Application No. PCT/CN2014/089973 filed on Oct. 31, 2014, which claims priority to and incorporates by reference the entire contents of Chinese priority document 201410334530.X, filed in China on Jul. 14, 2014.

TECHNICAL FIELD

The present invention relates to the field of display technologies, and in particular, to an organic light-emitting diode and a method for preparing the same.

BACKGROUND

In an Organic Light-Emitting Diode (OLED), the hole mobility of the hole transport material is much larger than the electron mobility of the electron transport material, and this causes an imbalance between the numbers of electrons and holes in the composite region and lowers the composite probability of excitons, thus the current efficiency and power efficiency of the OLED will be low.

In the prior art, in order to improve the electron injection and transportation capacity in an OLED, the following two methods are usually employed:

A method of employing N-type doping in the electron transport layer: as shown in FIG. 1, an N-type dopant 11 is doped in an electron transport material 12 according to a certain ratio. This is realized via coevaporation, but an accurate doping ratio of the N-type dopant to the electron transport material is required. This is difficult to be controlled during practical operation, and the repeatability of the experiment is poor.

A method of employing double electron injection layers: although the injection potential barrier of electrons may be lowered by this method, which is favorable for direct injection of electrons, the mobility of electrons in the transport layer cannot be improved.

SUMMARY

The technical problem to be solved by the invention is to improve the electron injection and transportation capacity in an OLED device, so that carrier concentration can be balanced, exciton utilization can be improved, thereby the photoelectric properties of the OLED device can be improved.

As directed to the above technical problem to be solved, the invention provides an organic light-emitting diode.

The organic light-emitting diode according to the invention at least includes a luminescent layer between an anode and a cathode; and the organic light-emitting diode further includes at least two electron transport layers set between the luminescent layer and the cathode, and an N-type doped layer set between every two adjacent electron transport layers.

During implementation, a ratio of a sum of thicknesses of said at least two electron transport layers to a sum of thicknesses of all the N-type doped layers included in the organic light-emitting diode is in a preset ratio range;

The preset ratio range is larger than or equal to 5 and less than or equal to 10.

During implementation, the sum of the thicknesses of said at least two electron transport layers is in a preset thickness range.

The preset thickness range is larger than or equal to 25 nm and less than or equal to 35 nm.

During implementation, the sum of the thicknesses of all the N-type doped layers included in the organic light-emitting diode is larger than or equal to 3.5 nm and less than or equal to 5.0 nm.

During implementation, the number of layers of the electron transport layers included in the organic light-emitting diode is 2, 3 or 4.

During implementation, the organic light-emitting diode of the invention further includes: a hole injection layer and a hole transport layer that are set in turn between the anode and the luminescent layer, an electron injection layer that is set between the cathode and the electron transport layer closest to the cathode, and a glass substrate; wherein, the anode is set on the glass substrate.

The invention further provides a method for preparing an organic light-emitting diode, wherein the organic light-emitting diode at least comprises a luminescent layer between an anode and a cathode.

The method for preparing an organic light-emitting diode according to the invention includes:

forming at least two electron transport layers between the luminescent layer and the cathode; and forming an N-type doped layer between every two adjacent electron transport layers.

During implementation, a ratio of a sum of thicknesses of said at least two electron transport layers to a sum of thicknesses of all the N-type doped layers included in the organic light-emitting diode is in a preset ratio range;

The preset ratio range is larger than or equal to 5 and less than or equal to 10.

During implementation, the sum of the thicknesses of said at least two electron transport layers is in a preset thickness range.

The preset thickness range is larger than or equal to 25 nm and less than or equal to 35 nm.

During implementation, the sum of the thicknesses of all the N-type doped layers included in the organic light-emitting diode is larger than or equal to 3.5 nm and less than or equal to 5.0 nm.

During implementation, the number of layers of the electron transport layers included in the organic light-emitting diode is 2, 3 or 4.

During implementation, the method for preparing an organic light-emitting diode according to the invention further includes:

forming the anode on a glass substrate;

setting a hole injection layer and a hole transport layer in turn between the anode and the luminescent layer; and setting an electron injection layer between the cathode and the electron transport layer closest to the cathode.

In comparison with the prior art, the organic light-emitting diode of the invention employs at least two electron transport layers, and an N-type doped layer is set between every two adjacent electron transport layers, that is, the electron transport material and the N-type dopant are sequentially evaporated in turn, and the electron injection and transportation capacity is improved by forming an N-type doping-like effect from interface dope effect and the diffusion of an N-type dopant, so that carrier concentration can be balanced, and exciton utilization can be improved, thereby the photoelectric properties of the OLED device can be improved.

DETAILED DESCRIPTION

Figure 1:
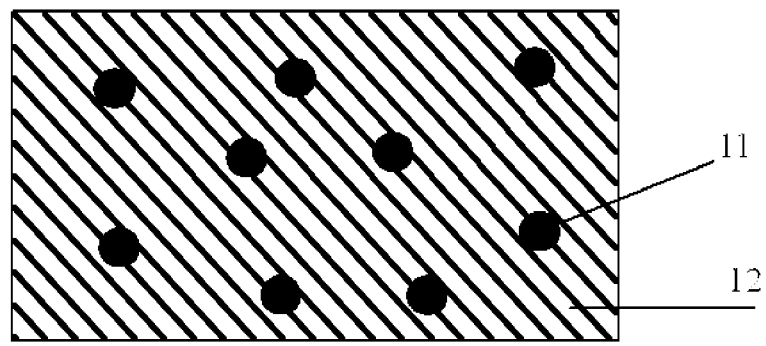
FIG. 1 is a schematic diagram of an existing method that employs N-type doping in an electron transport layer.

The technical solutions of the embodiments of the invention will be described clearly and fully in conjunction with the drawing of the embodiments of the invention. Apparently, the embodiments described are only a part of the embodiments of the invention, rather than being the whole embodiments. All other embodiments made by one of ordinary skills in the art based on the embodiments of the invention without creative work pertain to the protection scope of the invention.

The organic light-emitting diode according to one embodiment of the invention at least includes a luminescent layer between an anode and a cathode; and the organic light-emitting diode further includes: at least two electron transport layers set between the luminescent layer and the cathode, and an N-type doped layer set between every two adjacent electron transport layers. The sum of the thicknesses of said at least two electron transport layers is in a preset thickness range A.

In order to improve the balance between the numbers of electrons and holes in the carrier composite region of the organic light-emitting diode and simplify the preparation process, in one embodiment of the invention, at least two electron transport layers are employed, and an N-type doped layer is set between every two adjacent electron transport layers, that is, the electron transport material and the N-type dopant are sequentially evaporated in turn, and the electron injection and transportation capacity is improved by forming an N-type doping-like effect from interface dope effect and the diffusion of an N-type dopant, so that carrier concentration can be balanced, exciton utilization can be improved, and the photoelectric properties of the OLED device can be improved.

In comparison with the method of the prior art that employs N-type doping in an electron transport layer, for the method in which an electron transport material and an N-type dopant are sequentially evaporated in turn according to one embodiment of the invention, it is easier to be operated and controlled, the preparation process may be simplified, and the balance between electrons and holes may be improved, which is favorable for improving the photoelectric properties of the OLED device.

During specific implementation, the preset thickness range A is larger than or equal to 25 nm and less than or equal to 35 nm.

During specific implementation, the sum of the thicknesses of all the N-type doped layers included in the organic light-emitting diode is larger than or equal to 3.5 nm and is less than or equal to 5.0 nm.

In the preparation of a bottom luminescent device, the thickness of the electron transport layer generally is not too large; in one embodiment of the invention, the sum of the thicknesses of each electron transport layer is set as 25 nm-35 nm according to the selection of the material of each layer of the organic light-emitting diode, and then the sum of the thicknesses of each N-type dopant layer is set as 3.5 nm-5 nm according to the optimal doping ratio of the electron transport material to the N-type dopant, thus the current-illumination characteristic parameters of the device, for example, current density, brightness, efficiency and drive voltage, etc., may be improved greatly.

Specifically, a ratio of a sum of thicknesses of said at least two electron transport layers to a sum of thicknesses of all the N-type doped layers included in the organic light-emitting diode is in a preset ratio range B;

When the preset ratio range B is larger than or equal to 5 and less than or equal to 10, the performance of the OLED device will be optimized.

By tests, because different luminescent materials have different carrier mobility, the number of layers of the electron transport layers included in the organic light-emitting diode is concerned with the structure of the organic light-emitting diode, and the number of layers of the electron transport layers included in the organic light-emitting diode may be in a range of 2-4.

The material of the electron transport layer may be 4,7-diphenyl-1,10-orthophenanthrolene (BPhen), 1,3,5-tri[(3-pyridyl)-3-phenyl]benzene (TmPyPB) or 2,2'-(1,3-phenyl)di[5-(4-teriarybutylphenyl)-1,3,4-oxadiazole] (OXD-7). The material of the electron transport layer is not limited to the materials listed above.

The material of the N-type doped layer may be alkali metal salts with small atomic radius such as sodium bicarbonate ($NaHCO_3$), lithium cobalt oxide ($LiCoO_2$) or lithium carbonate ($Li_2CO_3$), etc.

Figure 2:
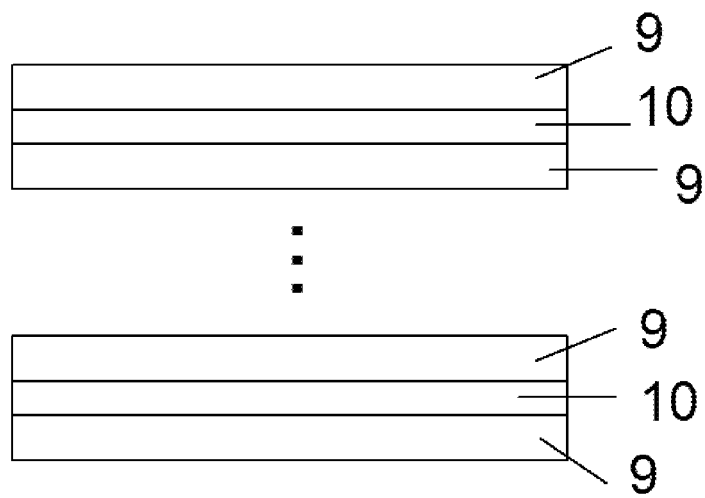
FIG. 2 is a structural representation of an N-type doped electron transport layer included in the organic light-emitting diode according to one embodiment of the invention.

Specifically, the organic light-emitting diode includes an N-type doped electron transport layer, which has a plurality of repeating unit structures, set between the luminescent layer and the cathode, that is, during the evaporation of an electron transport layer, the electron transport material and the N-type dopant are sequentially evaporated in turn. As shown in FIG. 2, each repeating unit includes two electron transport layers 9 and an N-type doped layer 10 set between the two electron transport layers 9.

Figure 3:
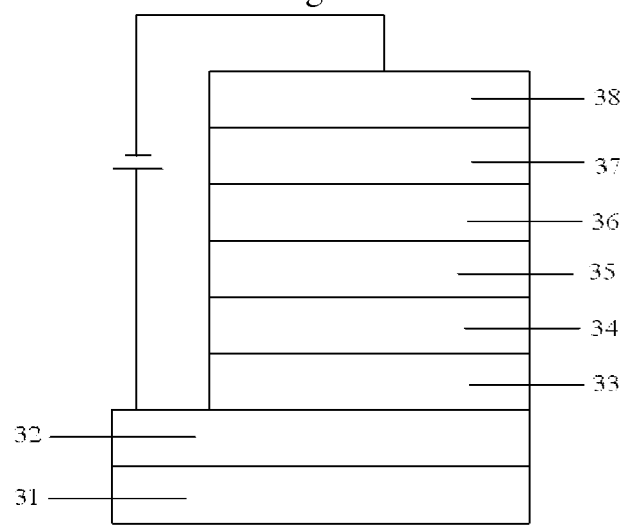
FIG. 3 is a structural representation of an organic light-emitting diode according to one embodiment of the invention.

As shown in FIG. 3, the organic light-emitting diode according to one embodiment of the invention includes: a glass substrate 31; and an anode 32, a hole injection layer 33, a hole transport layer 34, a luminescent layer 35, an N-type doped electron transport layer 36, an electron injection layer 37 and a cathode 38 that are set in turn on the glass substrate 31;

Two leads are led out from the anode 32 and the cathode 38 respectively and connected to an external DC drive power supply.

The material of the hole injection layer 33 may be an inorganic material, for example, molybdenum trioxide ($MoO_3$), nickel oxide $(NiO)_x$ or vanadium pentoxide ($V_2O_5$), etc.; the thickness of the hole injection layer 33 may be 1 nm-5 nm;

The material of the hole transport layer 34 may be an organic material, for example, N,N'-phenyldiphenyl-N,N'-(1-naphthyl)-1,1'-biphenyl-4,4'-diamine (NPB) or 4,4',4''-tri(carbazol-9-yl) triphenylamine (TCTA), etc.; the thickness of the hole transport layer 34 may be 30 nm-40 nm;

The material of the luminescent layer 35 may be fluorescent dyes or phosphorescent dyes with different colors of red, blue and blue, etc.; the thickness of the luminescent layer 35 is about 20 nm-25 nm;

The material of the electron injection layer 36 is lithium fluoride (LiF), and the thickness of the electron injection layer 36 is about 0.8 nm;

The thickness of the aluminium cathode 38 may be 120 nm-150 nm;

The N-type doped electron transport layer 36 includes at least two electron transport layers and an N-type doped layer set between every two adjacent electron transport layers;

The material of the electron transport layer may be BPhen, TmPyPB or OXD-7, etc., and the thickness of the electron transport layer may be 25 nm-35 nm;

The material of the N-type doped layer is an alkali metal salt with small atomic radius, for example, $NaHCO_3$, $LiCoO_2$ and $Li_2CO_3$, etc.; the thickness of the N-type doped layer is larger than or equal to 3.5 nm and less than or equal to 5.0 nm, for example, 4.5 nm.

The N-type doped electron transport layer has a plurality of repeating unit structures, which includes n repeating units (n is an integer larger than or equal to 1); each repeating unit includes two electron transport layers and an N-type doped layer set between the two electron transport layers; no matter what the numerical value of n is, the total thicknesses of all the electron transport layers included in the N-type doped electron transport layer keeps constant, and an optimal OLED structure may be obtained by changing the value of n.

For example, the material of the electron transport layer is OXD-7, the total thicknesses of the electron transport layer is 30 nm, the N-type dopant employed by the N-type doped layer is $NaHCO_3$;

When n is 1, 2 and 3, the structures of the N-type doped electron transport layer are respectively as follows:

n=1:OXD-7(15 nm)/$NaHCO_3$(4.5 nm)/OXD-7(15 nm);

n=2:OXD-7(10 nm)/$NaHCO_3$(2.25 nm)/OXD-7(10 nm)/$NaHCO_3$(2.25 nm)/OXD-7(10 nm);

n=3:OXD-7(7.5 nm)/$NaHCO_3$ (1.5 nm)/OXD-7(7.5 nm)/$NaHCO_3$(1.5 nm)/OXD-7(7.5 nm)/$NaHCO_3$(1.5 nm)/OXD-7(7.5 nm);

By testing the photoelectric properties of the OLED device, the optimal value of n may be found. Preferably, n is 2, 3 or 4, the drive voltage of the OLED device may be lowered, and the photoelectric properties of the OLED device, for example, brightness and efficiency, etc., may be improved.

A method for preparing an organic light-emitting diode according to one embodiment of the invention includes:

forming at least two electron transport layers between the luminescent layer and the cathode; and forming an N-type doped layer between every two adjacent electron transport layers.

Specifically, a ratio of a sum of thicknesses of said at least two electron transport layers to a sum of thicknesses of all the N-type doped layers included in the organic light-emitting diode is in a preset ratio range;

Specifically, the sum of the thicknesses of said at least two electron transport layers is in a preset thickness range.

The preset thickness range is larger than or equal to 25 nm and less than or equal to 35 nm.

The sum of the thicknesses of all the N-type doped layers included in the organic light-emitting diode is larger than or equal to 3.5 nm and less than or equal to 5.0 nm.

The method for preparing an organic light-emitting diode according to one embodiment of the invention further includes:

forming the anode on a glass substrate;

forming a hole injection layer and a hole transport layer in turn between the anode and the luminescent layer; and forming an electron injection layer between the cathode and the electron transport layer closest to the cathode.

The above description only shows some preferred embodiments of the invention. It should be pointed out that, for one of ordinary skills in the art, various improvements and modifications can be made without departing from the principles of the invention, and these improvements and modifications should also be regarded as the protection scope of the invention.

What is claimed is:

1. An organic light-emitting diode, at least comprising a luminescent layer between an anode and a cathode, wherein, the organic light-emitting diode further comprises at least two electron transport layers set between the luminescent layer and the cathode and an N-type doped layer set between every two adjacent electron transport layers, and the N-type doped layer is in physical contact with the two adjacent electron transport layers, and wherein a ratio of a sum of the thicknesses of the at least two electron transport layers to a sum of the thicknesses of all the N-type doped layers included in the organic light-emitting diode is in a preset ratio range that is greater than or equal to 5 and less than or equal to 10.

2. The organic light-emitting diode according to claim 1, wherein, the sum of the thicknesses of said at least two electron transport layers is in a preset thickness range that is greater than or equal to 25 nm and less than or equal to 35 nm.

3. The organic light-emitting diode according to claim 2, wherein, the sum of the thicknesses of all the N-type doped layers included in the organic light-emitting diode is larger than or equal to 3.5 nm and less than or equal to 5.0 nm.

4. The organic light-emitting diode according to claim 2, wherein, the number of layers of the electron transport layers included in the organic light-emitting diode is 2, 3 or 4.

5. The organic light-emitting diode according to claim 2, wherein, the organic light-emitting diode further comprises a hole injection layer and a hole transport layer that are set in turn between the anode and the luminescent layer, an electron injection layer that is set between the cathode and the electron transport layer closest to the cathode, and a glass substrate; wherein the anode is set on the glass substrate.

6. The organic light-emitting diode according to claim 1, wherein, the number of layers of the electron transport layers included in the organic light-emitting diode is 2, 3 or 4.

7. The organic light-emitting diode according to claim 1, wherein, the organic light-emitting diode further comprises a hole injection layer and a hole transport layer that are set in turn between the anode and the luminescent layer, an electron injection layer that is set between the cathode and the electron transport layer closest to the cathode, and a glass substrate; wherein the anode is set on the glass substrate.

8. A method for preparing an organic light-emitting diode, wherein, the organic light-emitting diode at least comprises a luminescent layer between an anode and a cathode, the method comprises:

forming at least two electron transport layers between the luminescent layer and the cathode;

forming an N-type doped layer between every two adjacent electron transport layers, wherein the N-type doped layer is in physical contact with the two adjacent electron transport layers, and wherein a ratio of a sum of the thicknesses of the at least two electron transport layers to a sum of the thickness of all the N-type doped layers included in the organic light-emitting diode is in a preset ratio range that is greater than or equal to 5 and less than or equal to 10.

9. The method for preparing an organic light-emitting diode according to claim 8, wherein, the sum of the thicknesses of said at least two electron transport layers is in a preset thickness range that is greater than or equal to 25 nm and less than or equal to 35 nm.

10. The method for preparing an organic light-emitting diode according to claim 9, wherein, the sum of the thicknesses of all the N-type doped layers included in the organic light-emitting diode is larger than or equal to 3.5 nm and less than or equal to 5.0 nm.

11. The method for preparing an organic light-emitting diode according to claim 9, wherein, the number of layers of the electron transport layers included in the organic light-emitting diode is 2, 3 or 4.

12. The method for preparing an organic light-emitting diode according to claim 9, further comprising:
   forming the anode on a glass substrate;
   forming a hole injection layer and a hole transport layer in turn between the anode and the luminescent layer; and
   forming an electron injection layer between the cathode and the electron transport layer closest to the cathode.

13. The method for preparing an organic light-emitting diode according to claim 8, wherein, the number of layers of the electron transport layers included in the organic light-emitting diode is 2, 3 or 4.

14. The method for preparing an organic light-emitting diode according to claim 8, further comprising:
   forming the anode on a glass substrate;
   forming a hole injection layer and a hole transport layer in turn between the anode and the luminescent layer; and
   forming an electron injection layer between the cathode and the electron transport layer closest to the cathode.

* * * * *